PRINTED CIRCUITS AND METHOD OF SOLDERING THE SAME

Filed May 2, 1955

INVENTORS
William S. Murray
John Robert Dyer, Jr.
BY
Curtis Morris + Safford
ATTORNEYS United States Patent Office 2,909,833

Patented Oct. 27, 1959

2,909,833

PRINTED CIRCUITS AND METHOD OF SOLDERING THE SAME

William S. Murray, Utica, and John Robert Dyer, Jr., Whitesboro, N.Y., assignors to The Indium Corporation of America, Utica, N.Y.

Application May 2, 1955, Serial No. 505,158

1 Claim. (Cl. 29—155.5)

This invention relates to printed circuits and more particularly to an improved method of soldering the leads from electrical circuit components to the conductors of the printed circuit, as well as to an improved printed circuit assembly made by the method.

As is well known in the art printed circuits are commonly made by adhering a conductive foil, e.g. copper to a non-conductive base, usually a laminated plastic, applying a resist to the exposed surface of the foil, and etching away the portions of the foil not covered by the resist to leave a desired pattern of conductors which comprises the printed circuit. The electrical components to complete the circuit are mounted on the opposite side of the base, and leads from these electrical components extend through the base adjacent to the conductors of the printed circuit and are soldered thereto. In order to minimize labor costs it is the usual practice to effect the soldering of the leads to the conductor by dipping the conductor side of the printed circuit assembly into a soldering bath. However the use of such a dip-soldering operation creates certain problems, among which is a tendency of the laminated plastic base of the printed circuit assembly to become warped or otherwise deformed when it is subjected to the temperature of the molten solder. Also, the adhesives used to cause the conductors to adhere to the plastic base tend to deteriorate when subjected to the solder bath temperature, thereby causing the conductors to peel off the plastic base.

It is accordingly an object of the present invention to provide an improved method of soldering printed circuits. It is another object of the invention to provide a method whereby electrical component leads can be dip-soldered to the conductors of a printed circuit without distortion of the base of the printed circuit assembly or separation of the circuit conductors from the base. It is still another object of the invention to provide a printed circuit assembly having uniformly well-soldered joints between the electrical component leads and conductors of the printed circuit, an undistorted non-conductive base, and improved adherence of the printed circuit conductors to the base. Other objects of the invention will be in part obvious and in part pointed out hereafter.

In general, the objects of the present invention are achieved by utilizing metallic indium as an agent for reducing the temperature at which soldering takes place and the time required for soldering. The indium is used both as a pre-coating for the printed circuit conductors and as a constituent of the solder bath. In carrying out the present process a thin layer of indium or an indium alloy is applied to the printed circuit conductors in any suitable manner such as by plating, brush-plating or spraying. The electrical circuit component leads are then brought into a position adjacent to the printed circuit conductors in the usual manner, and the leads and conductors are dipped into a soldering bath composed of a relatively low melting point indium alloy containing at least 20% indium with the remainder being either tin or a mixture of lead and tin. The soldering operation is preferably carried out in an inert or reducing atmosphere e.g. an atmosphere of hydrogen or cracked ammonia. The glues commonly used for adhering the printed circuit conductors to the base tend to deteriorate at temperatures of the order of 350° F., and hence the solder bath of the present invention is preferably composed of an alloy having a melting point below 300° F. so that the working temperature of the solder bath is below or at least not substantially above the temperature of deterioration of the glue.

The many objects and advantages of the present invention can best be understood and appreciated by reference to the accompanying drawing which illustrates the steps of a preferred embodiment of the present method and wherein.

Figure 1:
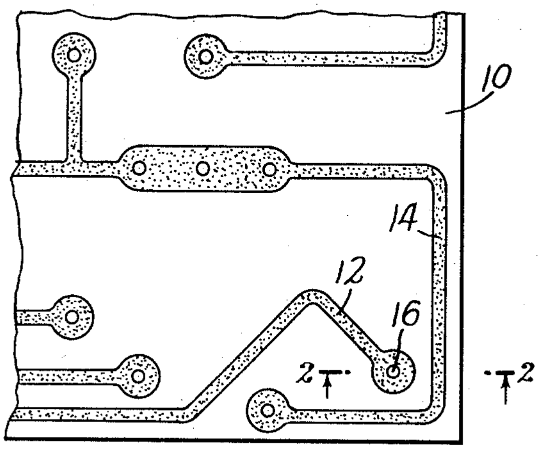
Figure 1 is a fragmentary plan view of the conductor side of a printed circuit assembly.
Figure 2:
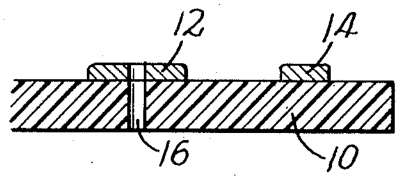
Figure 2 is a fragmentary vertical section taken on the line 2—2 of Figure 1 and showing a pair of conductors mounted on the base of the assembly with a hole extending through the base and one of the conductors for reception of an electrical component lead.
Figure 3:
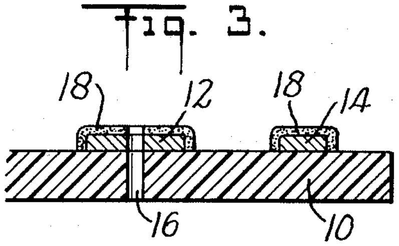
Figure 3 is a view similar to Figure 2 and showing an indium-containing coating applied to the conductors.

Referring to the drawings and particularly to Figures 1 and 2, the printed circuit assembly there shown comprises a plastic base 10 having conductors 12 and 14 secured thereto by a suitable adhesive. Extending through plastic base 10 and conductor 12 there is a hole 16 adapted to receive one of the leads from an electrical component. In accordance with the present process the conductors 12 and 14 are coated in any suitable manner with a thin layer 18 of indium or an indium alloy. For example, the indium layer 18 may be applied by electroplating from any of various known types of indium-plating baths. A typical plating bath that has been extensively used commercially comprises 130 gms. per liter of indium, 130 gms. per liter of dextrose, 360 gms. per liter of potassum cyanide and 190 gms. per liter of potassium hydroxide. A suitable coating of indium on conductors 12 and 14 can be obtained by making them cathodic in such a bath and plating at a current density of 15–20 amperes per square foot.

Figure 4:
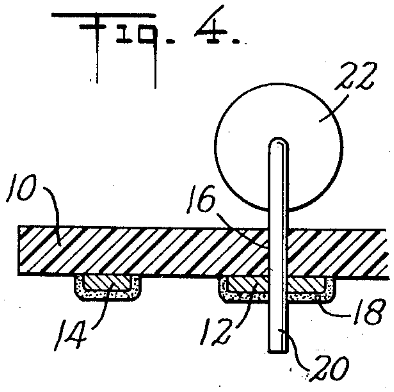
Figure 4 shows the structure of Figure 3 with an electrical component lead positioned therein for soldering.
Figure 5:
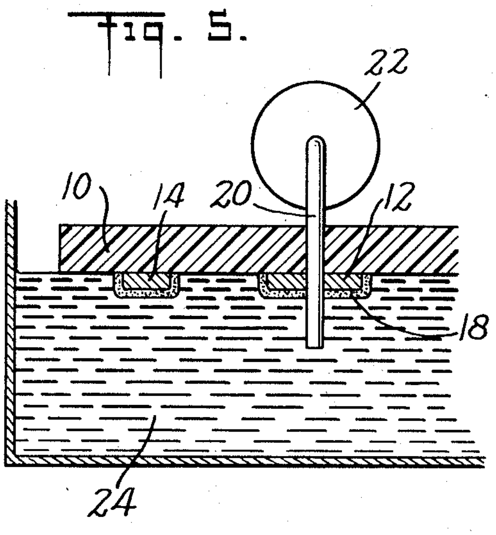
Figure 5 shows the assembly positioned in a soldering bath.

Referring to Figure 4, after the indium has been applied to the conductors 12 and 14 a lead 20 of an electrical component 22 is passed through the hole 16 in the plastic base 10, and lead 20 and is thus positioned adjacent to the indium layer that has been plated on the conductor 12. Thereafter as shown in Figure 5, the lower portion of the printed circuit assembly, including conductors 12 and 14 and the lower portion of lead 20, is dipped in a molten solder bath 24. As indicated above, the solder bath 24 is composed of an indium alloy having a melting point below 300° F. A particularly suitable alloy for this purpose contains approximately equal weight quantities of indium and tin and has a melting point of 244° F. Alternatively an indium-tin-lead alloy may be used for preparing the solder bath, for example, an alloy containing approximately 25% indium, 37.5% tin and 37.5% lead. This lead-containing indium alloy has a melting point of approximately 280° F. and hence can be used at a temperature low enough to avoid rapid disintegration of the glue by means of which the conductors are attached to the plastic base. Also the temperatures of these soldering baths are sufficiently low so that warping of the plastic base is inhibited.

Figure 6:
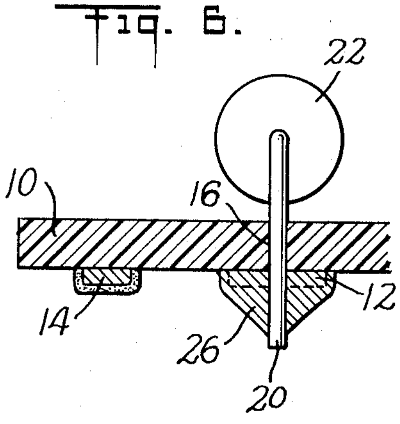
Figure 6 shows the soldered joint after removal of the assembly from the bath.

Figure 6 of the drawing illustrates the structure after removal from the soldering bath and particularly shows the soldered joint 26 between conductor 12 and lead 20. It will of course be understood that while only a single joint 26 is illustrated in the drawings, printed circuits normally include a variety of electrical components to be connected to conductors of the printed circuit, and the necessary connections can be made simultaneously in a single dip-soldering step by the present method.

If desired, a suitable soldering flux can be applied to the conductor 12 and lower portion of lead 20 before insertion in the soldering bath 24. However, when the conductor 12 is pre-coated with indium and the soldering bath contains a substantial proportion of indium, wetting of the conductor by the molten solder is so rapid, complete and effective that the use of a flux can ordinarily be omitted. Moreover, wetting of the conductor surface is so complete and rapid that only a very short period of contact with the molten bath is required. This short contact period further reduces the probability of degradation of the glue by means of which the conductors are fastened to the plastic base and the likelihood that the plastic base will be warped.

It is of course to be understood that the foregoing description is illustrative and that various modifications therein may be made. For example, the lower end of lead 20, as well as conductor 12, may be coated with indium or an indium-containing alloy. Also the indium coating can be applied by spray coating or brush-plating as well as by the plating procedure specifically described.

In one previously known process for making printed circuits a copper foil mounted on a plastic base is coated with a photosensitive material of the type that is solubilized by exposure to light. The coating is then masked in such manner as to leave exposed a pattern corresponding to the desired conductor pattern, and the unmasked portions of the coating are exposed to light. The light-exposed portions of the coating are washed from the assembly to expose the underlying conductor pattern of copper, and the copper pattern is plated with an alloy of lead and tin. Thereafter the remainder of the photosensitive coating is removed from the assembly and it is etched in, for example, a chromic acid bath wherein the copper foil is dissolved, except for the conductor pattern which has previously been plated with the lead-tin alloy. The plastic base and conductors as thus formed are assembled into a printed circuit as described above.

In carrying out the process as just described, it has been found that an oxide coating forms on the surface of the lead-tin alloy which interferes with the subsequent soldering operation, and that this oxide layer must be removed by pumicing just prior to soldering. In accordance with the present invention this pumicing step can be eliminated by applying to the conductor pattern, after it has been plated with the lead-tin alloy and before immersion in the chromic acid bath, a thin coating of indium and then heating the indium-coated conductors to cause the indium to diffuse into the lead-tin layer. Such diffusion can be effected, for example, by heating the assembly 150 C. for ½ hour. The indium coating, as described above, improves the wetting of the conductors by the solder.

We claim:

A method of making a printed circuit including electrical conductors having electrical circuit components soldered thereto which comprises adhering an electrically conductive metal foil to a plastic base, coating said foil with a photosensitive resist, exposing to light portions of said coating corresponding to the desired pattern of said conductors, removing the light-exposed portion of said coating, plating said conductors with a lead-tin alloy, then applying a layer of indium to said conductors and heating them to cause said indium to diffuse into the lead-tin layer, removing the remainder of said coating from said foil, immersing said base and foil in an etching bath to remove the unplated portion of said foil from said base, positioning the leads from said electrical components adjacent to said conductors, and soldering said leads to said conductors by dipping them in a molten solder bath.

References Cited in the file of this patent

UNITED STATES PATENTS

| | | |
|---|---|---|
| 1,550,157 | Gillette | Aug. 18, 1925 |
| 2,443,119 | Rubin | June 8, 1948 |
| 2,464,821 | Ludwich et al. | Mar. 22, 1949 |
| 2,700,623 | Hall | Jan. 25, 1955 |
| 2,714,760 | Boam et al. | Aug. 9, 1955 |
| 2,716,268 | Steigerwalt | Aug. 30, 1955 |
| 2,717,840 | Bosch | Sept. 13, 1955 |
| 2,774,014 | Henry | Dec. 11, 1956 |
| 2,777,192 | Albright | Jan. 15, 1957 |

OTHER REFERENCES

Barney et al.: Electronics, April 1952, pg. 108.